United States Patent
Mazza et al.

(10) Patent No.: US 12,538,582 B2
(45) Date of Patent: Jan. 27, 2026

(54) INTEGRATED CIRCUIT STRUCTURE WITH MULTI-ROW CELL FOR ACCOMMODATING MIXED TRACK HEIGHT

(71) Applicant: GlobalFoundries U.S. Inc., Malta, NY (US)

(72) Inventors: James P. Mazza, Saratoga Springs, NY (US); Jia Zeng, Sunnyvale, CA (US); Xuelian Zhu, Sunnyvale, CA (US); Navneet K. Jain, Milpitas, CA (US); Mahbub Rashed, Cupertino, CA (US); Jacob Mazza, Highland, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 482 days.

(21) Appl. No.: 18/149,279

(22) Filed: Jan. 3, 2023

(65) Prior Publication Data
US 2024/0222356 A1  Jul. 4, 2024

(51) Int. Cl.
*H10D 89/10* (2025.01)

(52) U.S. Cl.
CPC .................................. *H10D 89/10* (2025.01)

(58) Field of Classification Search
CPC ........................ H10D 84/981; H01L 23/5286
See application file for complete search history.

(56) References Cited

U.S. PATENT DOCUMENTS

| 8,698,205 | B2 | 4/2014 | Tzeng et al. |
| 10,236,302 | B2 | 3/2019 | Correale, Jr. et al. |
| 2009/0033368 | A1 | 2/2009 | Pitts |
| 2019/0164949 | A1 | 5/2019 | Sio et al. |
| 2019/0355749 | A1 | 11/2019 | Do et al. |
| 2021/0224457 | A1 | 7/2021 | Guo et al. |

(Continued)

FOREIGN PATENT DOCUMENTS

| TW | 201312753 A | 3/2013 |
| TW | 202201678 A | 1/2022 |

OTHER PUBLICATIONS

U.S. Appl. No. 17/515,914, filed Nov. 10, 2021, entitled "Logic Cell Layout Design for High Density Transistors," 17 pages.

(Continued)

*Primary Examiner* — Mounir S Amer
*Assistant Examiner* — Alexander Belousov
(74) *Attorney, Agent, or Firm* — David Cain; Hoffman Warnick LLC

(57) ABSTRACT

A multi-row standard cell and an integrated circuit (IC) structure using the standard cell are provided. The IC structure includes a plurality of cell rows extending in a first direction. At least two cell rows of the plurality of cell rows have different row heights. The IC structure includes a multi-row standard cell positioned in two or more cell rows having different row heights. At least one active region is shared by portions of the multi-row cell across the at least two cell rows. The IC structure may also include one or more asymmetric shared power rails disposed in an asymmetric manner across a row boundary between the at least two cell rows of different row heights. The multi-row standard cells and IC structures allow placement of multi-row cells for mixed track height arrangements in a manner not limited to multiples of row heights.

20 Claims, 14 Drawing Sheets

(56) References Cited

U.S. PATENT DOCUMENTS

| | | |
|---|---|---|
| 2021/0279396 A1 | 9/2021 | Wang et al. |
| 2021/0366774 A1 | 11/2021 | Kao et al. |
| 2022/0059571 A1* | 2/2022 | Baek .................... H10D 84/907 |
| 2022/0114320 A1* | 4/2022 | Yu .......................... H10D 89/10 |

OTHER PUBLICATIONS

U.S. Appl. No. 17/812,790, filed Jul. 15, 2022, entitled "Integrated Circuit Structure with Cells Having Asymmetric Power Rail," 31 pages.

European Search Report for corresponding EP Application No. 23195592.3-1212 dated Mar. 19, 2024, 8 pages.

\* cited by examiner

INTEGRATED CIRCUIT STRUCTURE WITH MULTI-ROW CELL FOR ACCOMMODATING MIXED TRACK HEIGHT

BACKGROUND

The present disclosure relates to integrated circuit structures, and more specifically, to an integrated circuit structure and a multi-row standard cell for accommodating a mixed track height.

A standard cell, or simply cell, is a group of transistors and related interconnect elements that provide, for example, a given Boolean logic function (e.g., OR, AND, XNOR, XOR, etc.) or a storage function (latch or flip-flop). Cells can be coupled together to design application specific IC structures. Once mapped out, the structural design is converted into a physical layout.

Cells within a given library have a common dimension in a direction of polyconductor gates (Y-direction), which is referred to as a "cell height" of the cell. Cell height can also be stated in terms of "track height." "Track" means the minimum pitch of the lowest routing metal layer, e.g., a second metal layer (M2). Cell height can be stated in terms of a multiples of the track, e.g., a 7.5 track height cell with a minimum pitch of 64 nanometers (nm), would have a cell height of 480 nm, i.e., 7.5×64. Generally speaking, cells having a smaller cell height are denser in terms of circuitry therein, have less routing space available (smaller area), and are typically lower performance, lower power. Cells with a larger cell height typically have less dense circuitry, more routing options (larger area), and have higher power and performance.

The desired cells for a given IC structure are selected from a cell library and are mapped into cell rows in a grid. Current approaches provide different libraries with cells with different cell heights, e.g., Y1 and Y2 where Y1≠Y2, for a given technology node. FIG. 1 shows cells 10, 12 having different cell heights Y1 and Y2. As shown in FIGS. 2 and 3, cells can be arranged in rows in the grid that have a preselected row height that matches the cells' height, e.g., the track height or a multiple thereof. More particularly, in one approach shown in FIG. 2, cells 10 with a set cell height Y1, e.g., with a 2 track height, from a given library A are placed in rows in the grid with each row having a row height Y1, i.e., with a 2 track height. Similarly, as shown in FIG. 3, cells 12 with a set cell height Y2, e.g., with a 3 track height, from a given library B are placed in rows in the grid with each row having a row height Y2, i.e., with a 3 track height. A given row may be vertically adjacent to another row with cells from the same library and having the same row height. It is emphasized that certain row heights have been provided for illustration purposes only and are purposefully limited to fit the size of the page in a logical manner. It will be recognized by those with skill in the art that actual short/dense row heights may be generally in the range of 6-7.5 track height, and tall row heights may be in the range of 9-12 track heights.

In another approach, shown in FIG. 4, rows of cells from a first library A having a first cell height Y1, e.g., 2 track height, are placed in a row having a row height Y1, i.e., 2 track height, and that row may be vertically adjacent to another row having a row height Y2, e.g., 3 track height, for cells from a second, different library B having a second, different cell height Y2, i.e., 3 track height.

As technology nodes have scaled smaller, the ability to continue to scale the cells based on track height, e.g., gate pitch and/or metal pitch, within the cells has diminished. Standard cells that extend across multiple cell rows, referred to as multi-row standard cells, have been used to combine functionality of individual cells together. However, current multi-row standard cells have limitations. For example, multiple individual cells that provide a desired logic function can have a collective cell height in a would-be multi-row cell that does not fit within a given row height of the grid or does not fit in multiple adjacent rows as shown in the floorplan of FIG. 4. For example, multi-row standard cells having a cell height that is a multiple of row height, e.g., 2Y or 3X, may not be able to be placed in pairs of adjacent rows that have different multiple row heights, or across adjacent rows having different row heights. Similarly, multi-row standard cells with cell heights having mixed track heights, e.g., 4X+Y, may offer additional design benefits but cannot be used because they do not fit into conventional grid arrangements.

SUMMARY

An aspect of the disclosure related to an integrated circuit (IC) structure, comprising a plurality of cell rows extending in a first direction, wherein at least two cell rows of the plurality of cell rows have different row heights; a multi-row cell positioned in the at least two cell rows having different row heights, the multi-row cell having a cell height equal to a sum of the row heights of the at least two cell rows having different row height least one active region shared by portions of the multi-row cell across the at least two cell rows; and a first asymmetric shared power rail disposed in an asymmetric manner across a row boundary between the at least two cell rows.

Another aspect of the disclosure includes a multi-row standard cell for an integrated circuit (IC) structure having logic arranged in a plurality of cell rows extending in a first direction, wherein at least two cell rows of the plurality of cell rows have different row heights, the multi-row standard cell comprising: at least two portions, each portion configured to be positioned in a respective row of the at least two rows of the plurality of rows having different row heights, wherein a cell height of the at least two portions equals a sum of the row heights of the at least two rows having different row heights; at least one active region shared by the at least two portions; a first asymmetric shared power rail disposed in an asymmetric manner across a cell boundary between the at least two portions; and a plurality of transistors at a device layer in each of the at least two portions.

Another aspect of the disclosure is directed to an integrated circuit (IC) structure, comprising: a plurality of cell rows extending in a first direction, wherein at least two cell rows of the plurality of cell rows have different row heights; a multi-row cell positioned in the at least two cell rows having different row heights, the multi-row cell having a cell height equal to a sum of the row heights of the at least two cell rows having different row heights; and at least one active region shared by portions of the multi-row cell across the at least two cell rows.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
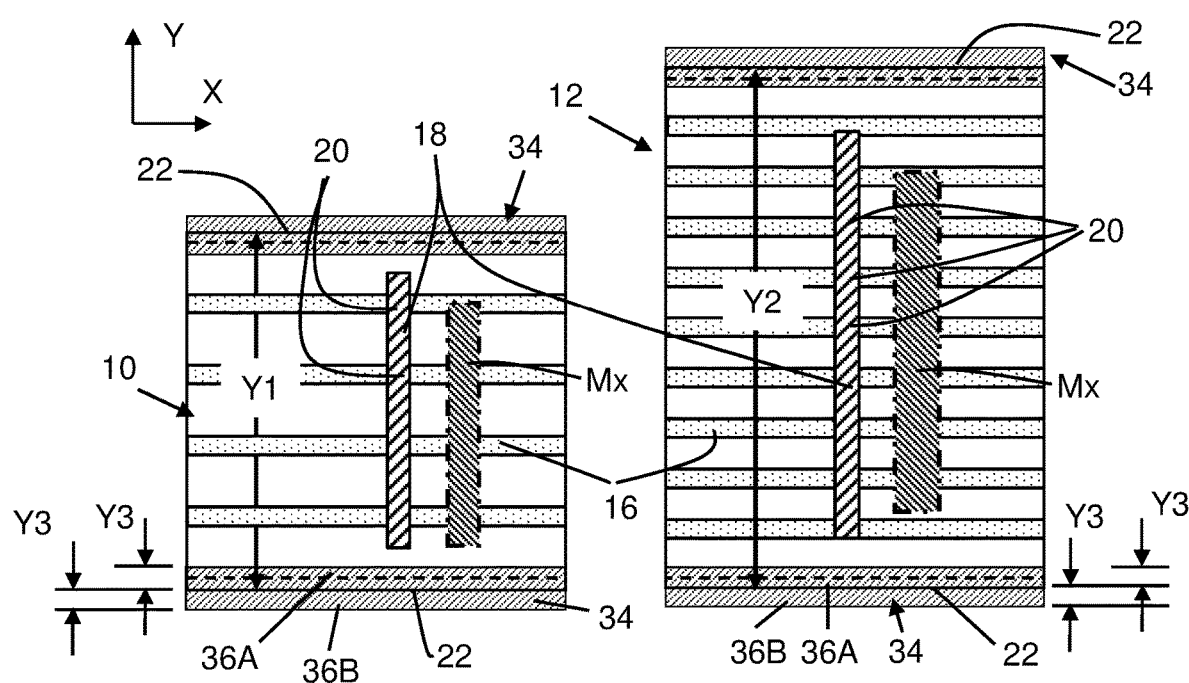
FIG. 1 shows a schematic top-down view of a couple of standard cells having different cell heights.
Figure 2:
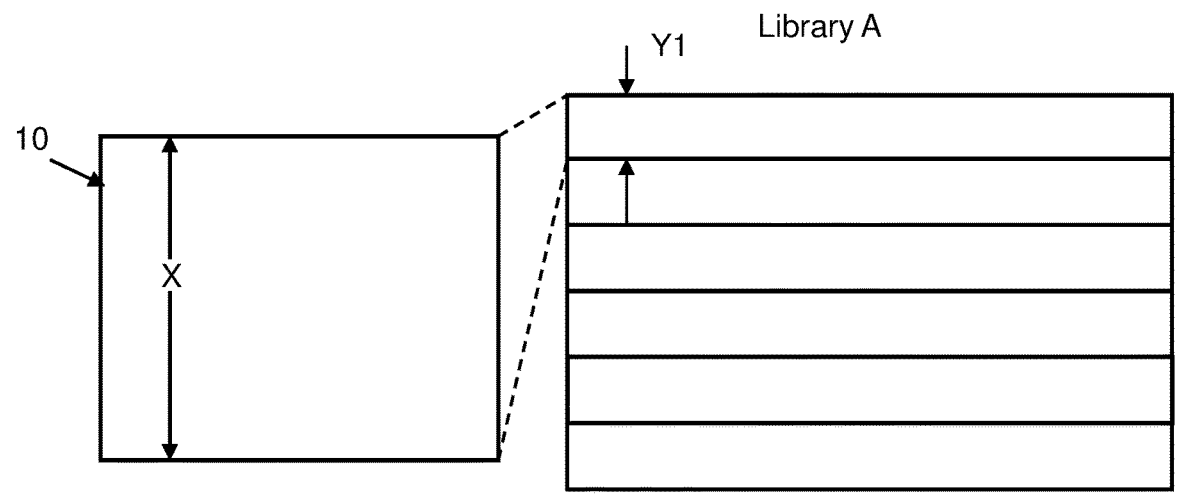
FIG. 2 shows a schematic top-down view of a prior art IC structure including a plurality of standard cells having the same cell height.
Figure 3:
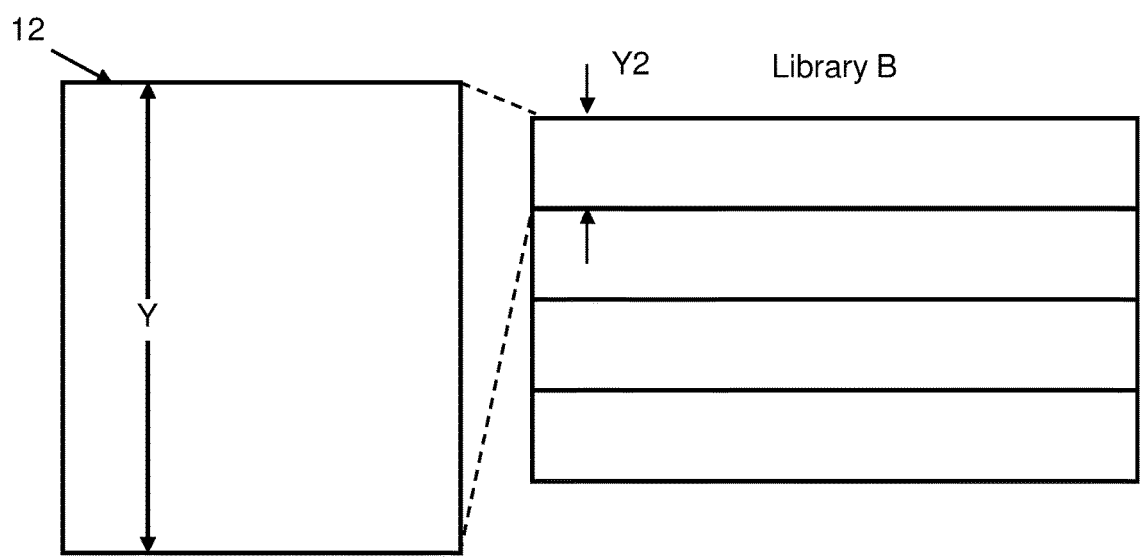
FIG. 3 shows a schematic top-down view of another prior art IC structure including a plurality of standard cells having different cell heights.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a multi-row standard cell and an integrated circuit (IC) structure using the multi-row standard cell. The IC structure includes a plurality of cell rows extending in a first direction. At least two cell rows of the plurality of cell rows have different row heights. The IC structure includes a multi-row standard cell positioned in the at least two cell rows having different row heights. The multi-row standard cell has a cell height equal to a sum of the row heights of the at least two cell rows having different row heights. At least one active region is shared by portions of the multi-row cell across the at least two cell rows. The IC structure may also include one or more asymmetric shared power rails disposed in an asymmetric manner across a row boundary between the at least two cell rows of different row heights. The multi-row standard cells and IC structures allow placement of multi-row cells for mixed track height arrangements in a manner not limited to multiples of row heights, i.e., beyond nX or mY row heights to include sums of multiples of row heights like 4X+2Y, 2X+Y, etc. That is, the multi-row standard cells allow forming combination cells with individual cells from different libraries that collectively have a cell height that is a combination of row heights that fits the grid. Hence, the logic functions available are not limited to those in any particular library design, i.e., with a specified cell height. The multi-row standard cell and IC structure allow optimization and flexibility relative to a number of parameters: power, performance, area, costs, yield, track planning for routing (crowding or design rule violations) and/or power grid for electromigration/voltage drop (EM/IR) issues.

Figure 4:
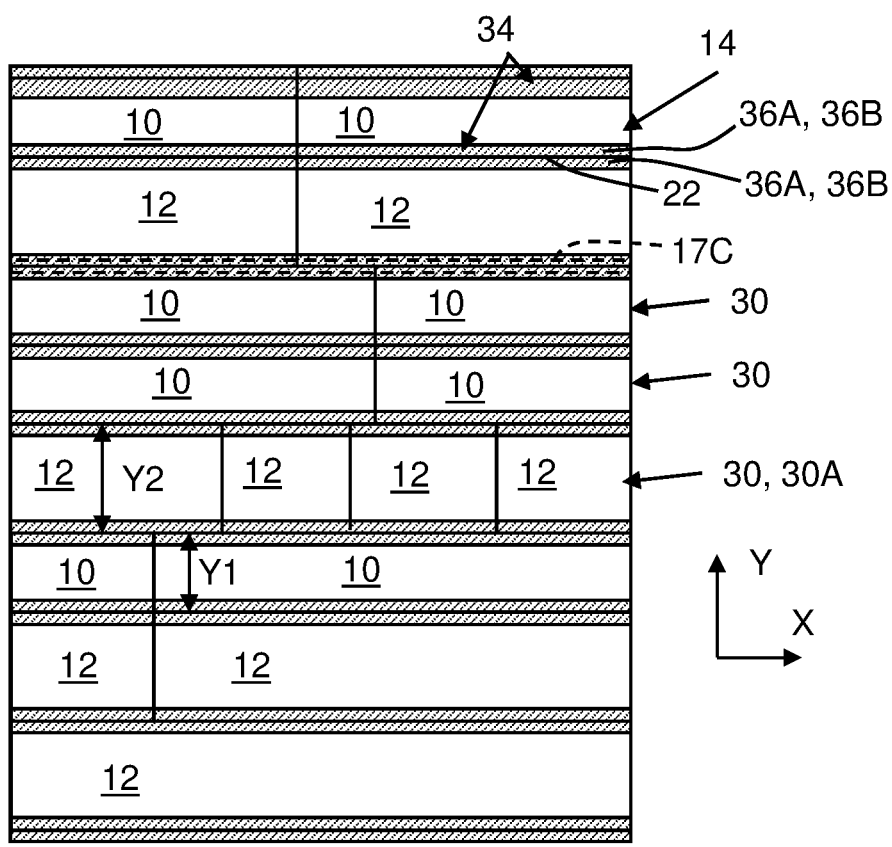
FIG. 4 shows a schematic top-down view of a prior art IC structure including a plurality of standard cells having different cell heights in respective rows having complementary row heights.

FIG. 1 shows a schematic top-down view of a device layer of a pair of prior art standard cells 10, 12 having heights Y1 and Y2 (Y1<Y2), respectively; and FIG. 4 shows a schematic top-down view of a prior art IC structure 14 including a plurality of standard cells 10, 12. A "standard cell", or simply "cell," is a group of transistors 20 and related interconnect elements that provide a given Boolean logic function (e.g., OR, AND, XNOR, XOR, etc.) or a storage function (latch or flip-flop). As shown in FIG. 4, cells 10, 12 can be coupled together to design application specific IC structures 14. FIG. 1 shows active regions 16, such as semiconductor fins, extending in the X-direction or width direction of cells 10, 12. (Note, a trench silicide layer used to connect active regions 16, e.g., fins, is not shown for clarity. However, in contrast to embodiments of the disclosure, active regions 16 are not shared between rows.) In a planar design, the active regions 16 would be larger rectangular elements encompassing the area of multiple fins, but do not extend between cells 10 or 12. Polyconductor gates 18 (only one shown for clarity) extend over any number active regions 16 to form a plurality of transistors 20. Other structures of transistors 20 are not shown for clarity, e.g., source/drain regions, contacts, diffusion breaks, gate cuts, etc.

Each cell 10, 12 has a height, e.g., Y1, Y2, respectively. As used herein, "height" or "cell height" indicates a dimension of the cell in a Y-direction (see legend) that is parallel to a direction of polyconductor gates 18 and extends from cell boundary 22 to cell boundary 22. Height can also be stated as "track height." "Track" means the minimum pitch of the lowest routing metal layer, e.g., a second metal layer (M2). Track height can be stated in terms of a multiples of the track, e.g., a 6 track cell has a height 6 times the minimum pitch of the lowest routing metal layer. Generally speaking, cells 10 having a smaller height, e.g., Y1, are denser in terms of circuitry therein, have less routing space available (smaller area), and are typically lower performance, lower power. Cells 12 with a larger height typically have less dense circuitry, more routing options (larger area), and have higher power and performance.

A "cell boundary" 22 is an edge of a cell 10, 12 where electrical isolation between two rows of cells exists typically due to a gate cut and/or an active area isolation, and where the cells abut vertically or horizontally. As shown in FIG. 4, cells 10, 12 meet at a boundary, so when cells 10, 12 are joined, a common isolation area 17C (below power rail 34 (only one shown)) is formed by the adjacent cells. As shown in FIG. 4, cells 10, 12 may be selected from "libraries" of cells having the same height, so they can be arranged in a grid together in rows 30 of common height cells. See, for example, row 30A in FIG. 4 with cells 12 of common height Y2. As shown by patterned hatching over cell boundaries 22, a power rail 34 is also defined relative to cell boundary 22 in each cell 10, 12. The power rail is a conductive line supplying electric power ($V_{dd}$ or ground) to the parts of cells 10, 12 through other interconnect layers of IC structure 14. Power rail 34 can be at any common metal layer within cells 10, 12, e.g., middle of line metal layer, back-end-of-line metal layers, first metal layer M1, and/or higher.

As shown in FIGS. 1 and 4, conventionally, active regions 16 do not extend between cells, and power rails 34 are defined to have half portions 36A, 36B straddling across a respective cell boundary 22. It will be recognized that while half portions 36A, 36B are both part of a design of any cell 10, 12, half portion 36B shown outside cell boundary 22 is a portion of power rail 34 formed once for two respective cells 10, 12. Half portions 36B shown outside cell boundary 22 are part of the design of the cell and schematically overlap in adjacent cells 10, 12, but are only formed once. As shown in FIG. 4, when cells 10, 12 are joined, the power rail half portions 36A, 36B collectively form power rail 34 between adjacent cells 10 or 12 in a lengthwise symmetrical manner across mating cell boundaries 22 of adjacent cells 10, 12.

To place cells 10, 12 easily in the grid shown in FIG. 4, each cell 10, 12, includes its own respective active region 16 (FIG. 1) within its cell boundary 22. Further, the mating half portions 36A, 36B for power rails 34 are all sized the same regardless of library and/or cell height. For example, each half portion 36A, 36B has height Y3 (FIG. 1). Consequently, the resulting power rails 34 have symmetric power rail half portions 36A, 36B across mating cell boundaries 22 of adjacent cells 10, 12.

As technology nodes have scaled smaller, the ability to continue to scale the cells based on track height, e.g., gate pitch and/or metal pitch, within the cells has diminished. To address this challenge, cells for a given logic function can have cell heights that do not fit within a given row height of the grid. The active regions 16 within respective cells 10, 12 and also the common sizing of the power rail half portions 36A-B across all libraries, also limits the ability to use multi-row standard cells that create desirable logic functions from a compilation of individual standard cells. For example, active regions 16 within library and each row 30 have to be the same size, which limits the size of FETs formed to a specific size. With regard to power rails, design rule violations can occur at placement, requiring re-design of the IC structure. For example, where power rail half portions 36A, 36B are sized for the larger cells 12, the smaller cells 10 can experience congestion issues, e.g., with power rail 34 too close to metal wiring in the same metal layer Mx (only one example shown in FIG. 1 for each cell 10, 12). Where power rail half portions 36A, 36B are sized for the smaller cells 10, the larger cells 12 can experience electromigration/voltage drop (EM/IR) issues, and related performance issues.

Figure 5:
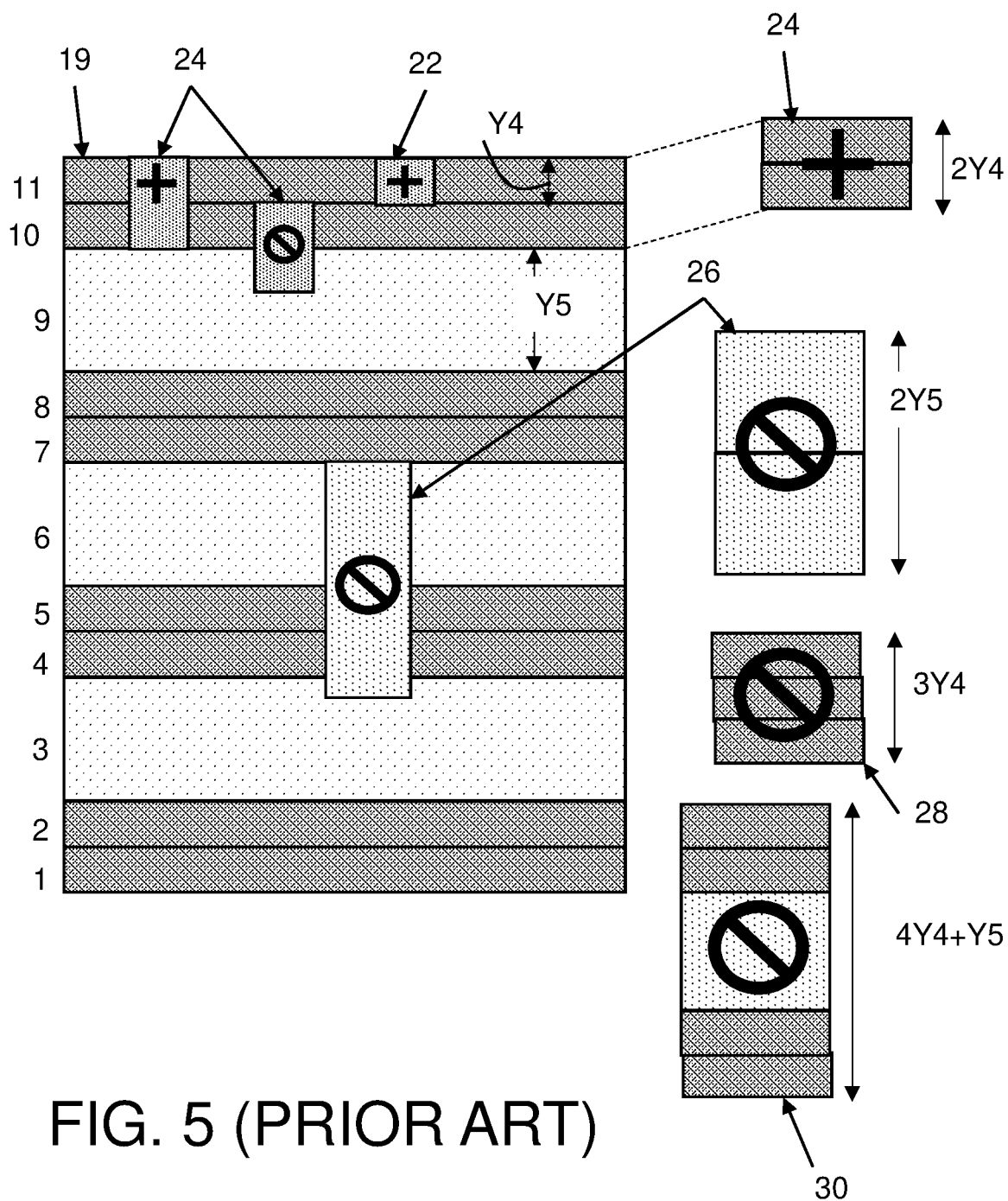
FIG. 5 shows a schematic top-down view of a prior art IC structure including a plurality of multi-row standard cells having different cell heights, some of which do not fit in the grid arrangement shown.

FIG. 5 shows examples of multi-row standard cells that do not fit in a grid 19. Grid 19 may have rows 1-11 having row heights Y4 or Y5 with pairs of adjacent rows, e.g., 1 and 2; 4 and 5; 7 and 8; and 10 and 11, having a collective 2Y4 row height. Row height Y5 does not equal twice row height Y4, i.e., Y5≠2Y4. Cells 22 having cell height Y4 can be placed into rows having row height Y4, e.g., 1, 2, 4, 5, 7, 8, 10 or 11, and cells having cell height Y5 can be placed into rows having row height Y5, e.g., 3, 6 or 9. Further, multi-row standard cells 24 having cell height 2Y4 can also be placed in pairs of adjacent rows, e.g., 1 and 2; 4 and 5; 7 and 8; and 10 and 11, that have a collective 2Y4 row height. However, multi-row standard cells 24 cannot be placed across rows 9 and 10 because row height Y5 of row 9 is not twice Y4, and active regions 16 are not shared. Multi-row standard cells 26, 28 that have cell heights, e.g., 2Y5 or 3Y4, that are multiples of row heights and need to extend over multiple rows may not fit into grid 19 where desired. Similarly, multi-row standard cells 30 with cell heights having mixed track heights, e.g., 4Y4+Y5, may offer additional design benefits, such as advantageous combined logic functions, but do not fit into grid 19.

Figure 6:
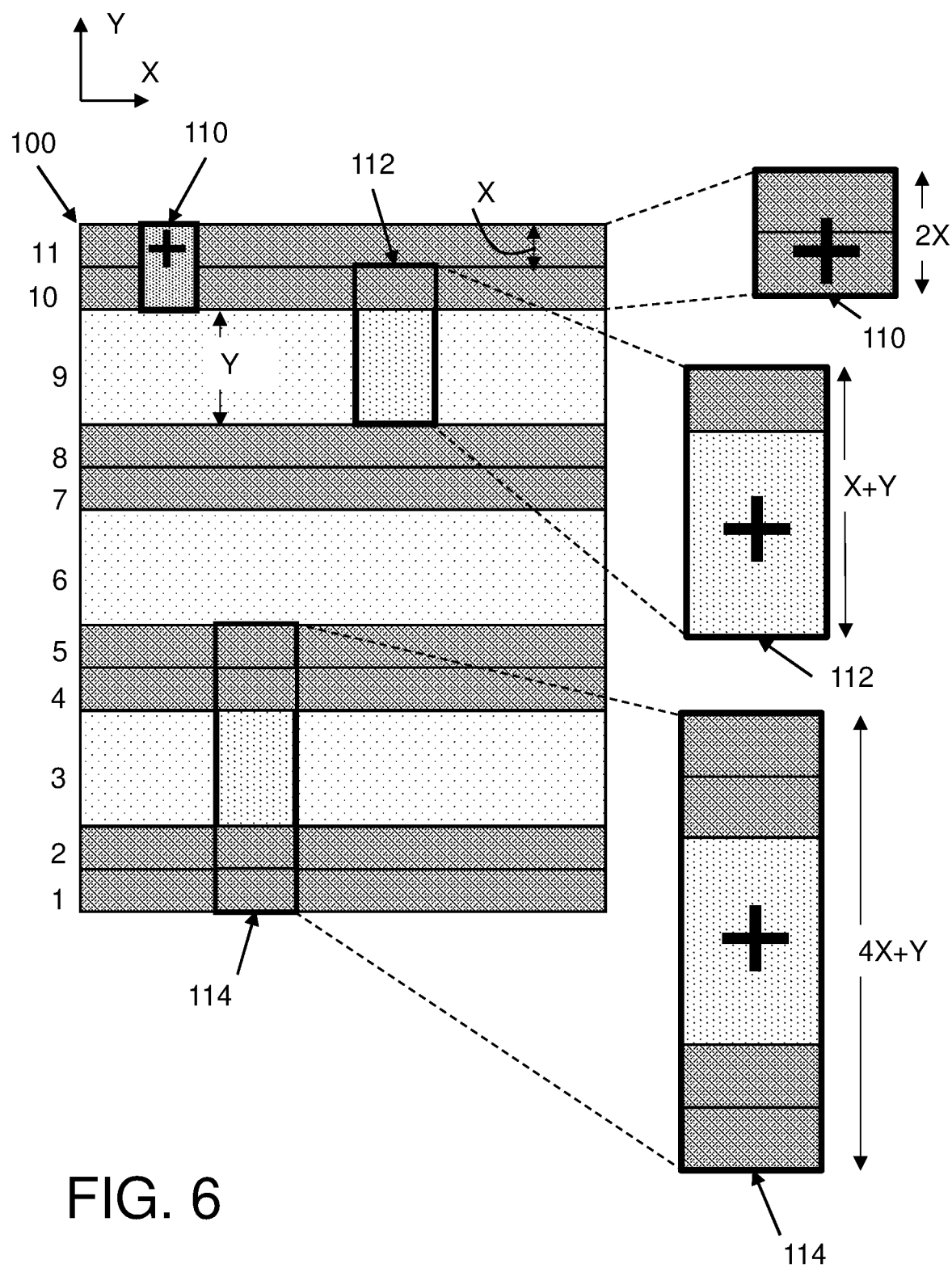
FIG. 6 shows a schematic top-down view of an IC structure including a plurality of multi-row standard cells, according to embodiments of the disclosure.
Figure 7:
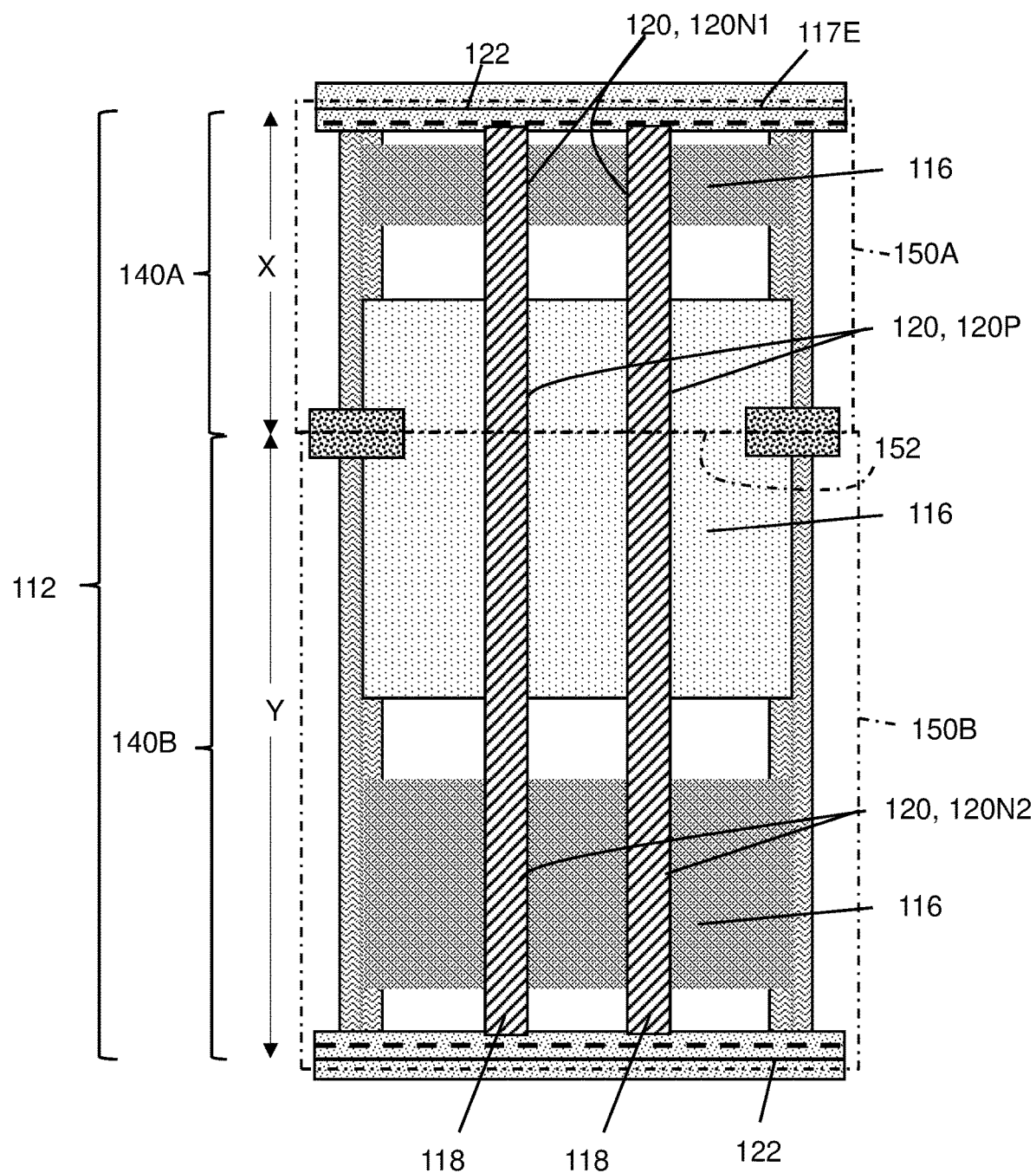
FIG. 7 shows a schematic top-down view of a multi-row standard cell, according to embodiments of the disclosure.

FIG. 6 shows a schematic top-down view of a device layer of an IC structure 100 with three illustrative multi-row standard cells 110, 112, 114 (hereafter simply "MR cells") having different heights 2X, X+Y and 4X+Y (where 2X≠Y), respectively. (Note, variable X for cell or row height X is used hereafter to more readily differentiate from a different cell or row height Y but is not meant to indicate dimension in the X-direction in the drawings). FIG. 7 shows a schematic top-down view of an enlarged portion of IC structure 100 including an illustrative MR cell 112 having cell height X+Y, where Y>X, positioned across a pair of rows 140A, 140B having different row heights, X and Y, respectively. MR cell 112 has portions 150A, 150B including combined individual standard cells. When describing MR cells herein, a height of an MR cell 110, 112, 114 may be referred to herein as "cell height," while a height of each portion 150A, 150B of MR cell 110, 112, 114 may be referred to herein as "individual cell height." Hence, cell height of an MR cell 110, 112, 114 is the cumulative cell height of all the individual cells of the multi-row cell. A height of a row may be referred to herein as "row height," and a height of a power rail may be referred to herein as "rail height."

As shown in FIGS. 6 and 7, IC structure 100 has logic arranged in a plurality of rows (e.g., 1-11 in FIG. 6, 140A-B in the enlarged view of FIG. 7) extending in a first direction, e.g., X direction. At least two cell rows, e.g., 9 and 10 in FIG. 6 or 140A-B in FIG. 7, of the plurality of cell rows have different row heights, e.g., X and Y. While certain rows are illustrated, it will be recognized that a large number of other rows may be provided with adjacent rows having the same row height or different row height.

With continuing reference to FIGS. 6 and 7, MR cells, such as MR cells 110, 112, 114, for IC structure 100 will now be described. (Hereafter, except where noted for differentiation between embodiments, the detailed description will generally reference one MR cell 112 for brevity, although the teachings are applicable to any MR cell described herein.) Each MR cell 112 includes at least two portions 150A, 150B. As will be described herein, MR cell 112 may include any number of portions 150 and cell rows 140. For example, in certain embodiments, each MR cell 112 may include at least three portions 150 and at least three cell rows 140, and in other embodiments, each MR cell 112 may include at least four portions 150 and at least four cell rows 140. Portions 150A, 150B are indicated by dashed boxes that are slightly larger than the actual portion for illustrative purposes. Each portion 150A, 150B is configured to be positioned in a respective row 140A, 140B of the plurality of rows having different row heights, e.g., X and Y. Portions 150A, 150B may include any logic functions desired and combined into a single cell for layout purposes. A cell height of MR cell 112 equals the sum of the row heights of the at least two cell rows 140A, 140B having different row heights. In the example shown in FIG. 7, the cell height of MR cell 112 is the sum of the row heights of rows 140A, 140B which match component cell heights of portions 150A, 150B. In this example, the sum is equal to X+Y. Portions 150A, 150B or MR cell 112 meet at a row boundary 152 between cell rows 140A, 140B.

Referring to FIG. 7 and with further regard to portions 150A-B and MR cell 112, MR cell 112 includes a plurality of transistors 120 at a device layer in each portion 150A-B, that collectively provide a given Boolean logic function (e.g., OR, AND, XNOR, XOR, etc.) or a storage function (latch or flip-flop). Transistors 120 can include any now known or later developed transistor structure. In the example shown, active regions 116 are in the form of bulk semiconductor, but other active regions are also possible, e.g., semiconductor fins as in FIG. 1. Polyconductor gates 118 (only two shown for clarity) extend over any number of active regions 116 to form a plurality of transistors 120. Other structures of transistors 120 are not shown for clarity, e.g., source/drain regions, contacts, diffusion breaks, gate cuts, etc. As will be described further, non-multi-row cells and MR cells 112 can be coupled together to provide application specific IC structures 100.

With further regard to active regions 116 in MR cell 112, in the example shown, MR cell 112 includes three active regions 116N1, 116P and 116N2, which may be for upper NFETs 120N1, middle PFETs 120P, and lower NFETs 120N2, respectively. As shown for active region 116P, MR cell 112 includes at least one active region 154 shared by the at least two portions 150A, 150B. While shared active region 154 is illustrated as a p-type active region 116P, it will be recognized that it can take the form of any n-type active region 116N1, 116N2. Shared active region 154 allows for a larger variety of logic functions to be provided within portions 150A, 150B. More particularly, where portions 150A, 150B may have previously been individual standard cells with their own performance capabilities and power requirements, MR cell 112 includes the logic functions of portions 150A-B thereof combined with a single active region 116.

Figure 8:
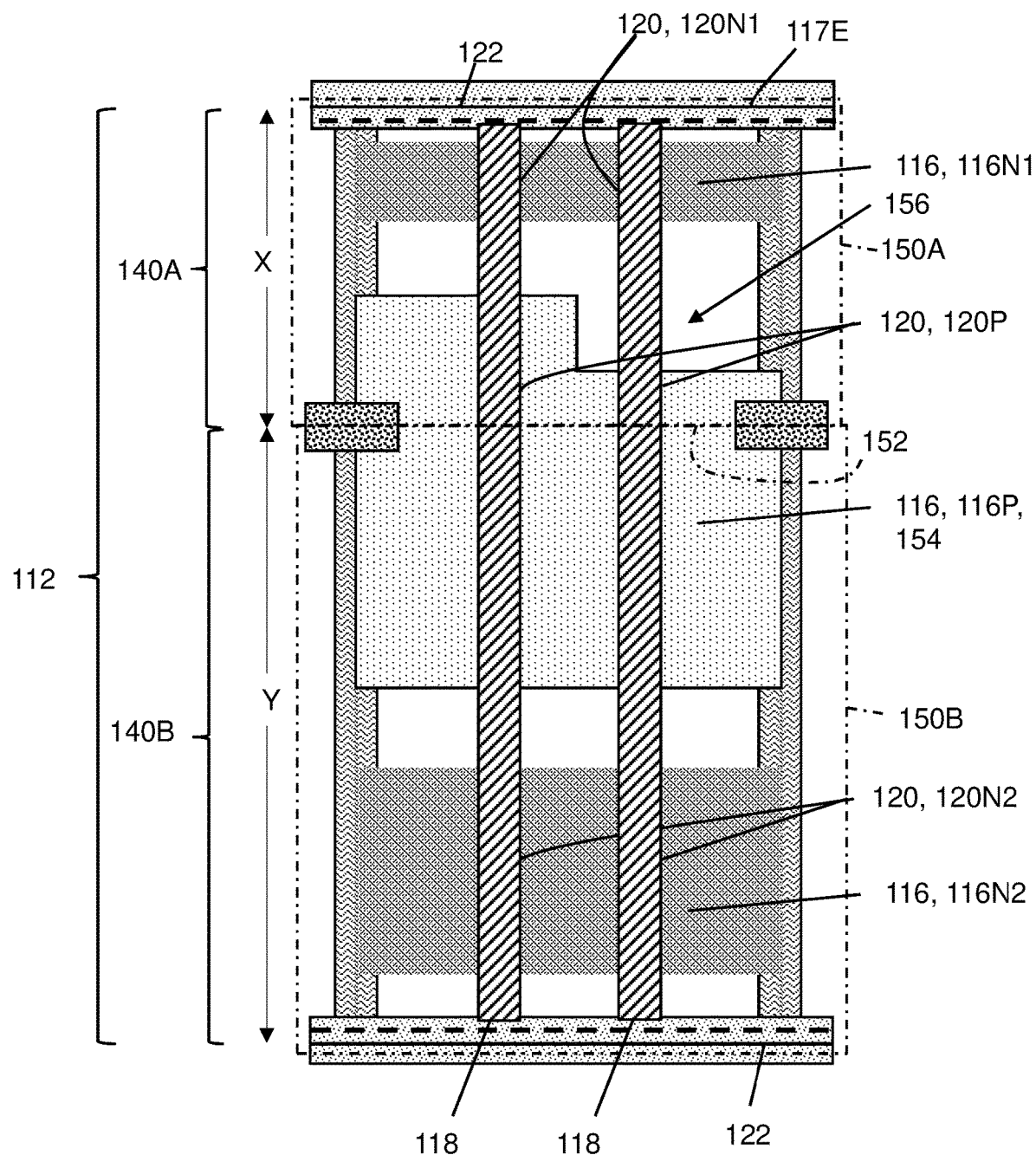
FIG. 8 shows a schematic top-down view of a multi-row standard cell, according to other embodiments of the disclosure.

Shared active region 154 can be customized to provide the desired performance capabilities and power requirements, among other parameters, for MR cell 112 and portions 150A-B. For example, FIG. 8 shows a schematic top-down view of an IC structure 100 including illustrative MR cell 112, as in FIG. 7, but with a shared active region 154 having at least one inward opening 156 therein. An "inward opening" 156 may include any area in which dopants present in the rest of the active region 154 are not present and that extends inwardly from an outer periphery of the otherwise would-be polygonal shape of the active region, e.g., square, rectangular. In FIG. 8, a right corner of the otherwise rectangular shared active region 154 is not doped, creating inward opening 156 that is not part of the active region. Inward opening 156 may include any number of inward openings in a given shared active region 154 and can take any desired shape and/or size (e.g., a jog) to obtain the desired operational parameters such as performance and power. Shared active region 156 can also be customized in any other known manner such as but not limited to dopant concentration, depth, polarity type, etc. Shared active region 154 removes the need to cut polyconductor gates 118, and removes the limitation that FETs are keyed to the size of the active region in a given individual cell. The shared active regions 154 can provide stronger forms of FETs, e.g., a larger PFET 120P, than available in the individual cells with better performance than available from the individual cells. Shared active region 154 further enables design flexibility of various row heights. For example, if an active region of a cell with row height X is limited to X/3, and an active region Y is limited to Y/3, and a gap between the active regions is typically Z, by combining various row heights together embodiments of the disclosure can achieve device widths of X/3+Y/3+Z, or Y/3+Y/3+Z, and so on.

Figure 9:
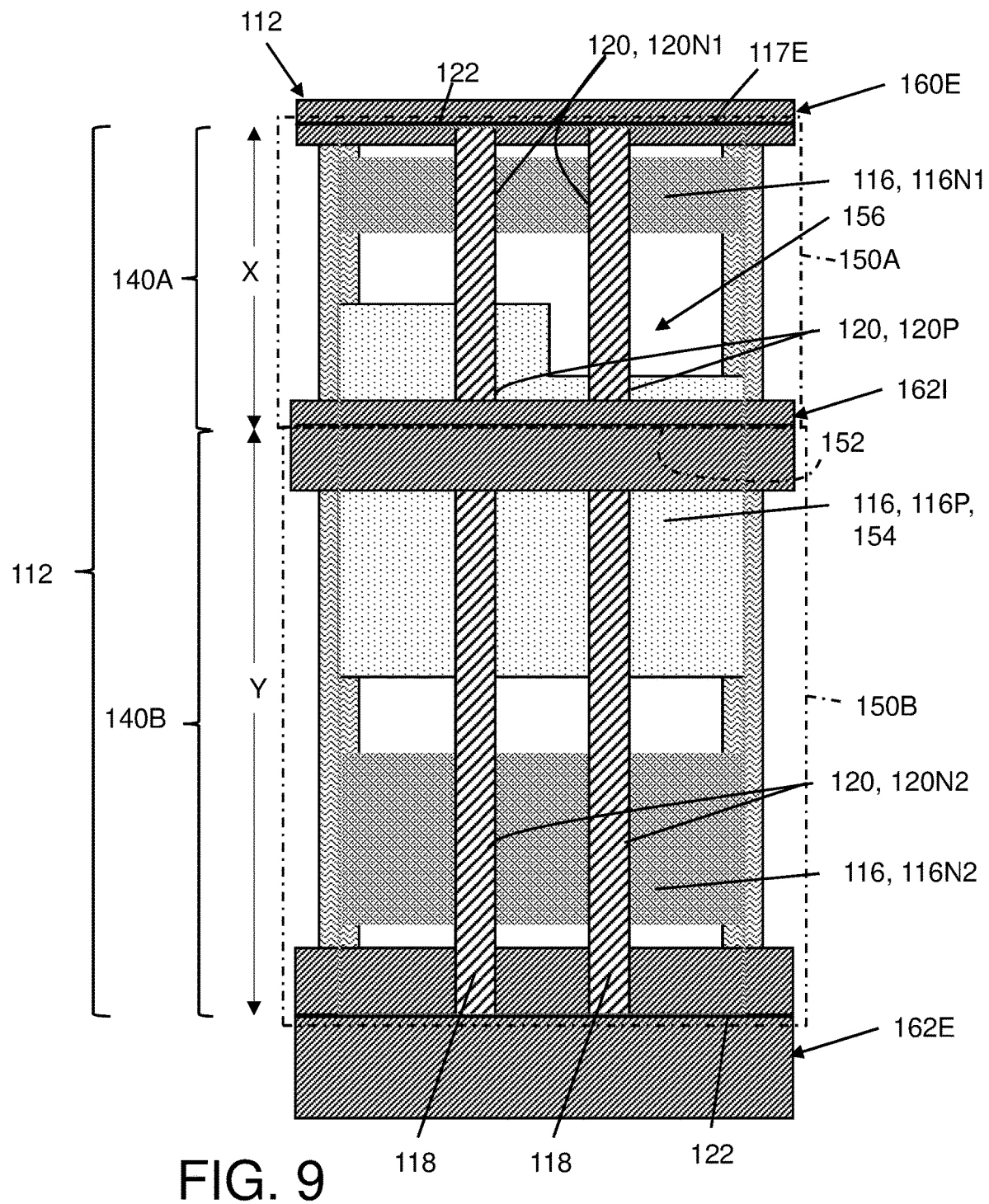
FIG. 9 shows a schematic top-down view of a multi-row standard cell with asymmetric and symmetric power rails shown overlaid on the structure of FIG. 8, according to embodiments of the disclosure.

MR cells 112 may also include various forms of shared power rails to mate with adjacent cells (MR cells or non-MR cells) and to mate respective portions 150A, 150B within a given MR cell. FIG. 9 shows a schematic top-down view of MR cell 112 of FIG. 8 with asymmetric shared power rails 162I and 162E and a symmetric shared power rail 160E shown overlaid on the structure. Note, where appropriate, power rails indicated with an "I" are for internal mating of portions 150 within an MR cell and those with an "E" are for external mating to adjacent cells, e.g., MR cells or non-MR cells. MR cells 112 may employ one or more symmetric shared power rails 160 and/or one or more asymmetric shared power rails 162 at various locations. Symmetric shared power rails 160 (hereafter "symmetric power rails 160" for brevity) may be used where adjacent cell rows (internal between portions 150 or external between adjacent cells) have the same row height, and asymmetric shared power rails 162 (hereafter "asymmetric power rails 162" for brevity) may be used where adjacent cell rows do not have the same row height (internal between portions 150 or external between adjacent cells).

In the example shown in FIG. 9, MR cell 112 may include a symmetric power rail 160E at an upper cell boundary 122 and an asymmetric power rail 162E at an opposing lower cell boundary 122. Symmetric power rail 160I is at upper cell boundary 122 to mate with another MR cell 112 or non-MR cell having the same row height, e.g., X. Asymmetric power rail 162E at the opposing cell boundary 122 mates with another MR cell 112 or non-MR cell having a different row height, e.g., with a larger row height than row height Y. In contrast to conventional multi-row cells, MR cell 112 also may include an asymmetric power rail 162I disposed in an asymmetric manner across a row boundary 152 between cell rows 140A, 140B therein. That is, asymmetric power rail 162I serves portions 150A, 150B of MR cell 112. Hence, asymmetric shared power rail 162I is disposed in an asymmetric manner across row boundary 152 between cell rows 140A, 140B within MR cell 112 to provide a shared power rail to the different row heights, X and Y, within MR cell 112.

Figure 10:
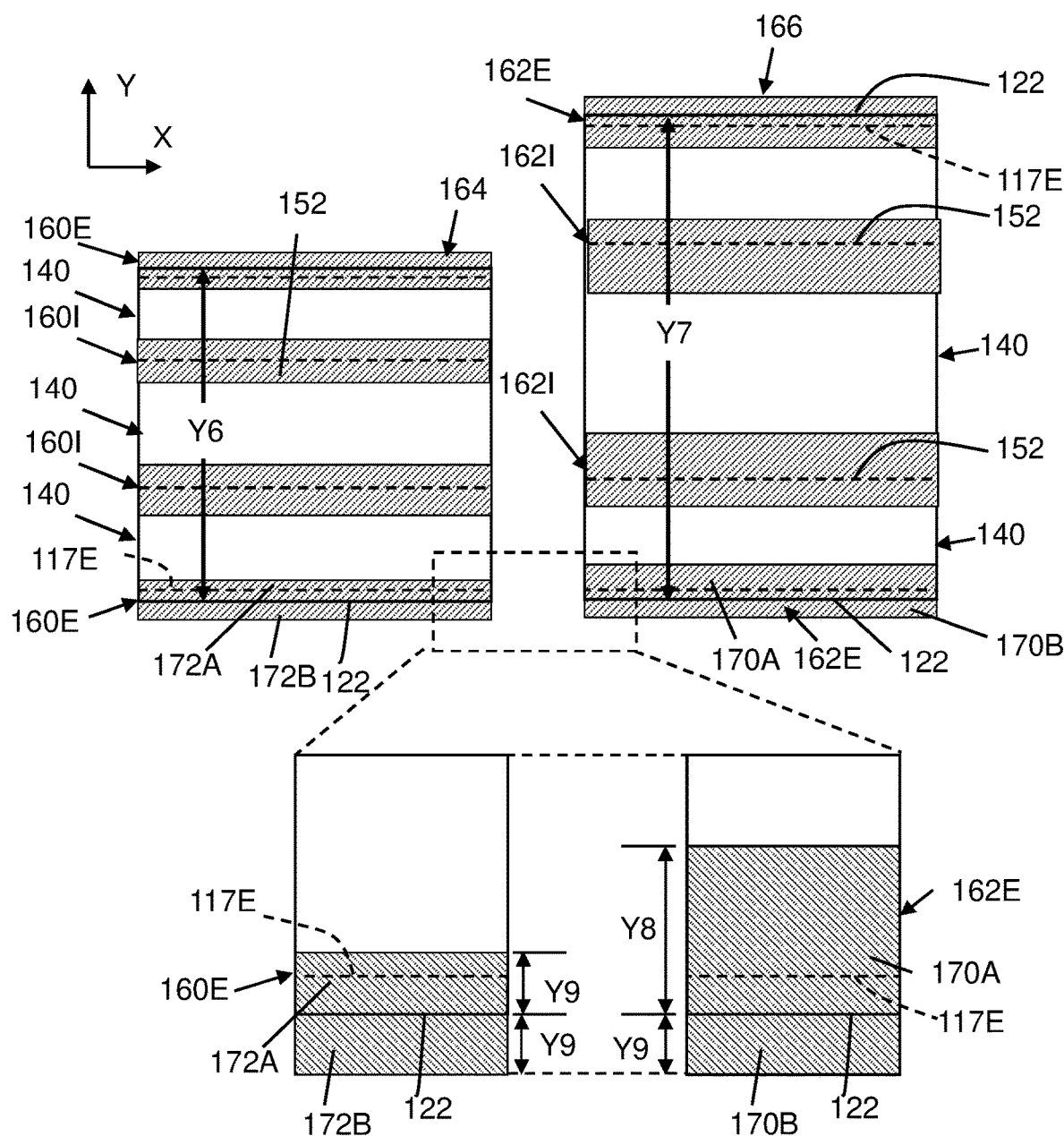
FIG. 10 shows a schematic top-down view of a device layer of a pair of illustrative multi-row standard cells having different cell heights, and with an enlarged area showing different portions of an asymmetric power rail, according to embodiments of the disclosure.

FIG. 10 shows a schematic top-down view of a device layer of a pair of illustrative multi-row standard cells 164, 166 having different cell heights Y6, Y7, and with an enlarged area showing different portions of an asymmetric power rail 162E, according to embodiments of the disclosure. As shown in FIG. 10, for example in MR cell 164, MR cells may also include symmetric power rails 160I disposed in a symmetric manner across a row boundary 152 between cell rows 140 having the same row height. Hence, symmetric power rail 160I is disposed in a symmetric manner across row boundary 152 between cell rows 140 within MR cell 164 to provide a shared power rail 160I for rows of the same row heights within MR cell 164.

Figure 11:
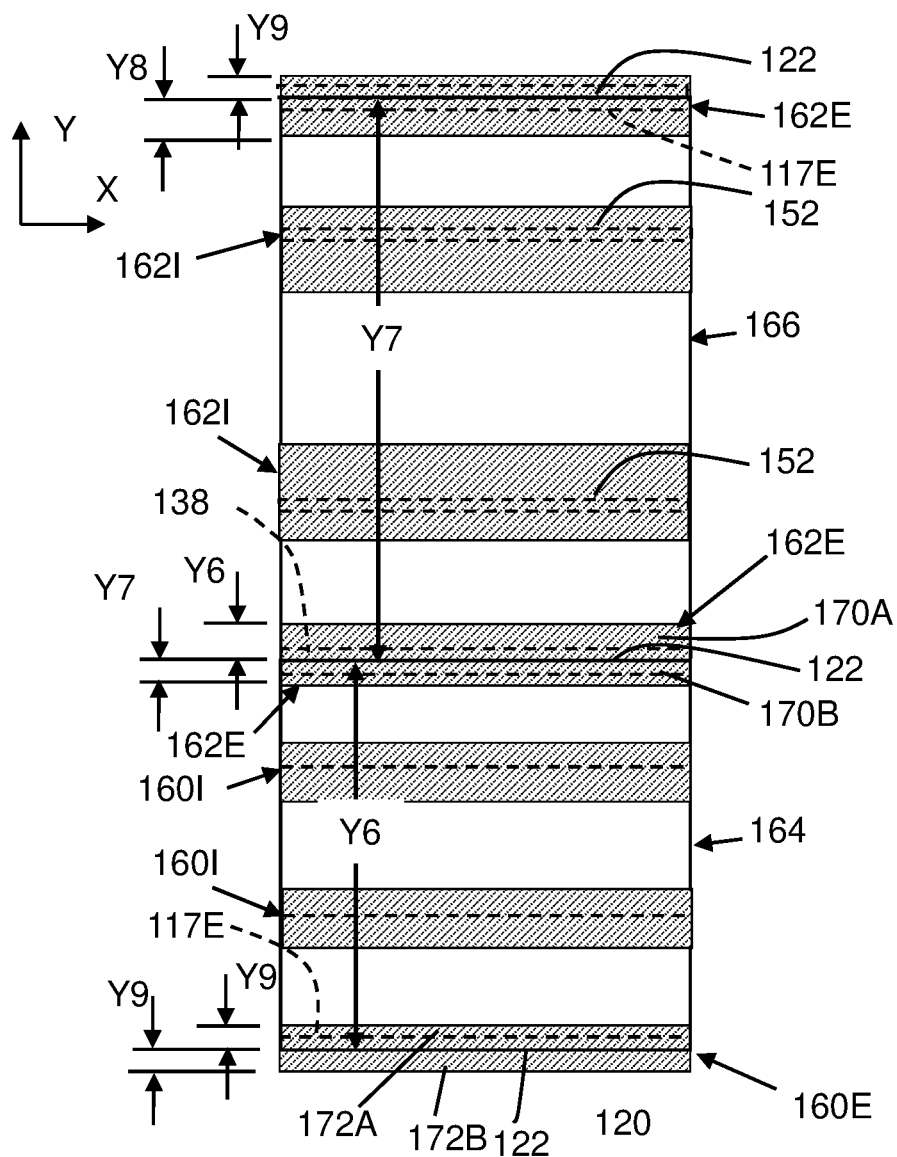
FIG. 11 shows a schematic top-down view of an illustrative pair of multi-row standard cells coupled together to form an asymmetric power rail, according to embodiments of the disclosure.

With further regard to the workings of power rails 160, 162 between adjacent MR cells and/or other non-MR cells or within an MR cell, FIG. 11 shows a schematic top-down (simplified) view of the illustrative pair of MR cells 164, 166 coupled together to form asymmetric power rail 162E (middle of drawing). As shown in FIGS. 7 and 8, MR cell 112, like cells 164, 166 in FIGS. 10 and 11, include at least a portion of an isolation area 117E at an edge of the device layer defining a cell boundary 122 (active regions at a cell boundary are not preserved). Isolation area 117E mates with a similar isolation area 117E in an adjacent MR cell 112 or other standard cell to form a complete isolation region 138 (dashed box in FIG. 11). MR cell 112 thus may include a plurality of transistors 120 at a device layer, and at least a portion of an isolation area 117E at an edge of the device layer defining cell boundary 122. Row boundaries 152 within MR cells 112 are not used for this purpose—there is no isolation because the active regions are intentionally shared between, for example, portions 150A, 150B.

As shown in the enlarged area in FIG. 10, asymmetric power rails 162 (162E as shown in an enlarged manner) for MR cell 166 has first portion 170A and second portion 170B having different rail heights Y8, Y9, respectively, such that power rail 162E is asymmetric across cell boundary 122. (As noted, height of power rails or portions thereof are sometimes referred to herein as "rail height" to distinguish from a height of a cell, i.e., "cell height"). In contrast, power rail 160E for MR cell 164 (shown in the enlarged area) has first portion 172A and second portion 172B having the same rail heights Y9, Y9, respectively, such that power rail 160 is symmetric across cell boundary 122 or row boundary 152. Although not shown for clarity, row boundaries 152 within MR cells 112 may be similarly arranged. It will be recognized that while portions 170A-B, 172A-B are part of a design of any cell, portions 170B, 172B shown outside cell boundary 122 or row boundary are portions of power rail 160, 162 formed once for two respective mating adjacent cells (MR cell or non-MR cell in the grid) or portions 150 of an MR cell. Portions 170B, 172B shown outside cell boundary 122 are part of the design of the cell and schematically overlap in adjacent cells (MR cell or non-MR cell) or portions 150 within a given MR cell but are only formed once. In the example shown in the enlarged area of asymmetric power rail 162E, rail height Y8 of first portion 170A is larger than rail height Y9 of second portion 170B of power rail 162 in cell 166. The difference between rail heights Y8, Y9 can be user defined depending on a large number of factors such as but not limited to: the desired power rail 162 overall height, power usage, performance desired, and/or available area (space). Rail height Y9 of second portion 170B can have dimensions selected to mate with whatever rail height is used at the next row (e.g., an outside rail portion 172B for symmetric power rails 160 in an adjacent cell), or a rail portion (not separately shown) for an adjacent portion 150A, 150B (FIG. 8) within an MR cell.

In view of the foregoing, power rails 160, 162 can be located for mating with an adjacent cell at any cell boundary 122, or mating of internal portions 150A-B (FIGS. 7-8) thereof at any row boundary 152 (FIG. 9) within an MR cell. In any event, power rails 160, 162 may be at any common metal layer within the IC structure, e.g., middle of line metal layer, back-end-of-line metal layers, first metal layer M1, and/or higher.

Figure 12:
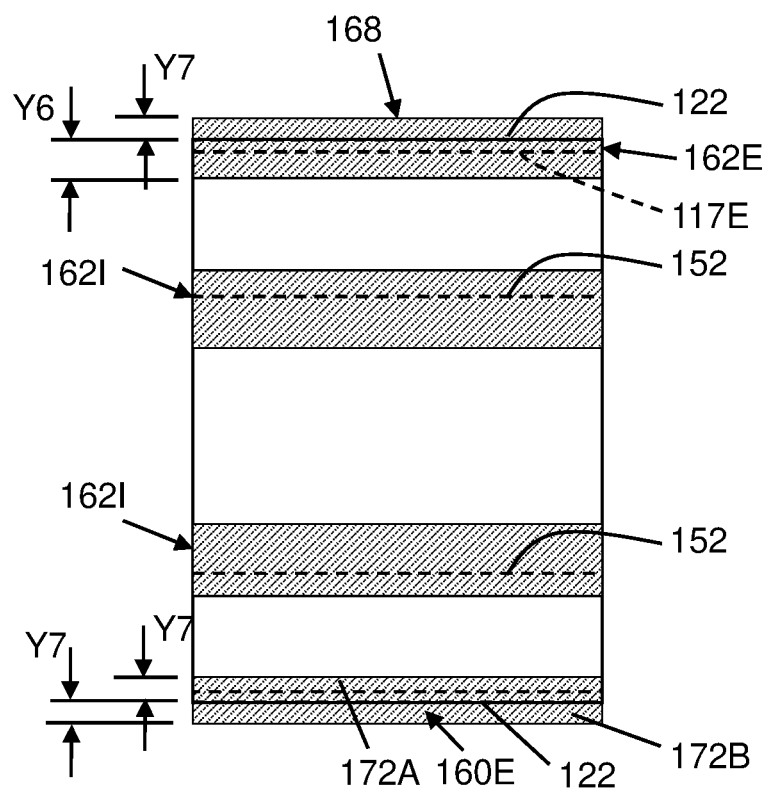
FIG. 12 shows a schematic top-down view of a device layer of a multi-row standard cell according to an alternative embodiment.

Although not necessary in all cases, in the example shown in FIG. 10, MR cell 164 includes a symmetric power rail 160E at both cell boundaries 122 thereof. Similarly, MR cell 166 includes an asymmetric power rail 162E at both cell boundaries 122 thereof. However, symmetric power rails 160E and asymmetric power rail 162E can both be used on the same MR cell. Each MR cell 164, 166 includes either symmetric power rails 160I or asymmetric power rails 162I. FIG. 12 shows a schematic top-down (simplified) view of a device layer of an illustrative MR cell 168 according to an alternative embodiment. In this case, MR cell 168 has an asymmetric power rail 162E at one cell boundary 122 (top as shown) and a symmetric power rail 160E on the other cell boundary 122 (bottom as shown). In this example, MR cell 168 also has asymmetric power rails 162I at two row boundaries 152 therein.

Figure 13:
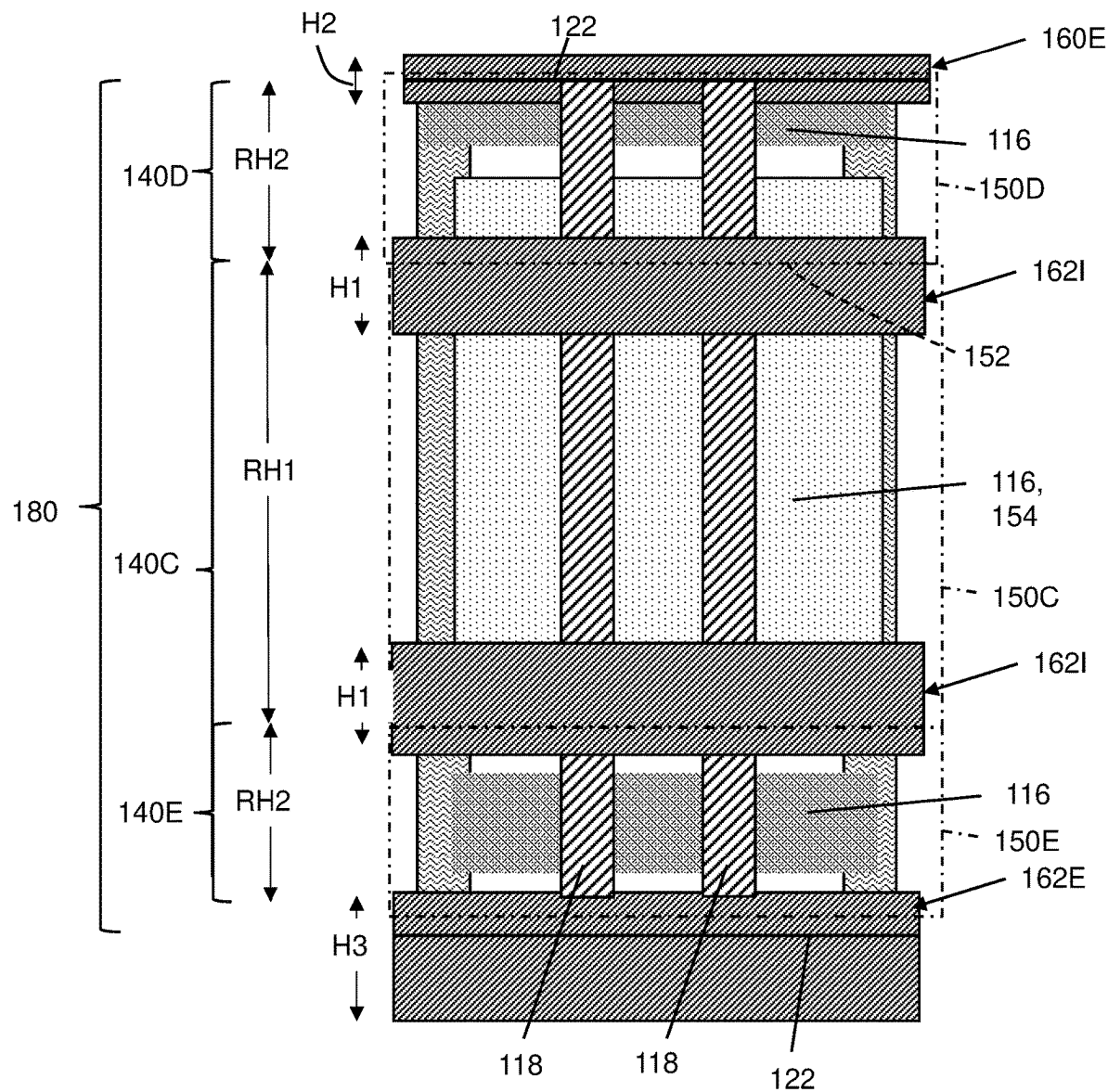
FIG. 13 shows a schematic top-down view of a device layer of a multi-row standard cell according to another embodiment.

MR cells can take a variety of forms incorporating portions 150 having different configurations. FIG. 13 shows a schematic top-down view of a device layer (with power rails overlaid) of an illustrative MR cell 180 according to an alternative embodiment. In this embodiment, MR cell 180 may include three portions 150C-E that collectively include at least one first cell row 140C having a first row height RH1 and at least two adjacent second cell rows 140D, 140E where the at least two adjacent cell rows 140D, 140E each have a second row height RH2 different than first row height RH1. The at least one first cell row 140C is adjacent to at least two adjacent second cell rows 140D, 140E, e.g., one on each end of first cell row 140C as shown. The cell height of MR cell 180 equals the sum of first row height(s) RH1 of the at least one first cell row 140C and the second row heights RH2 of the at least two adjacent second cell rows 140D, 140E, i.e., cell height=RH1+2RH2.

Figure 14:
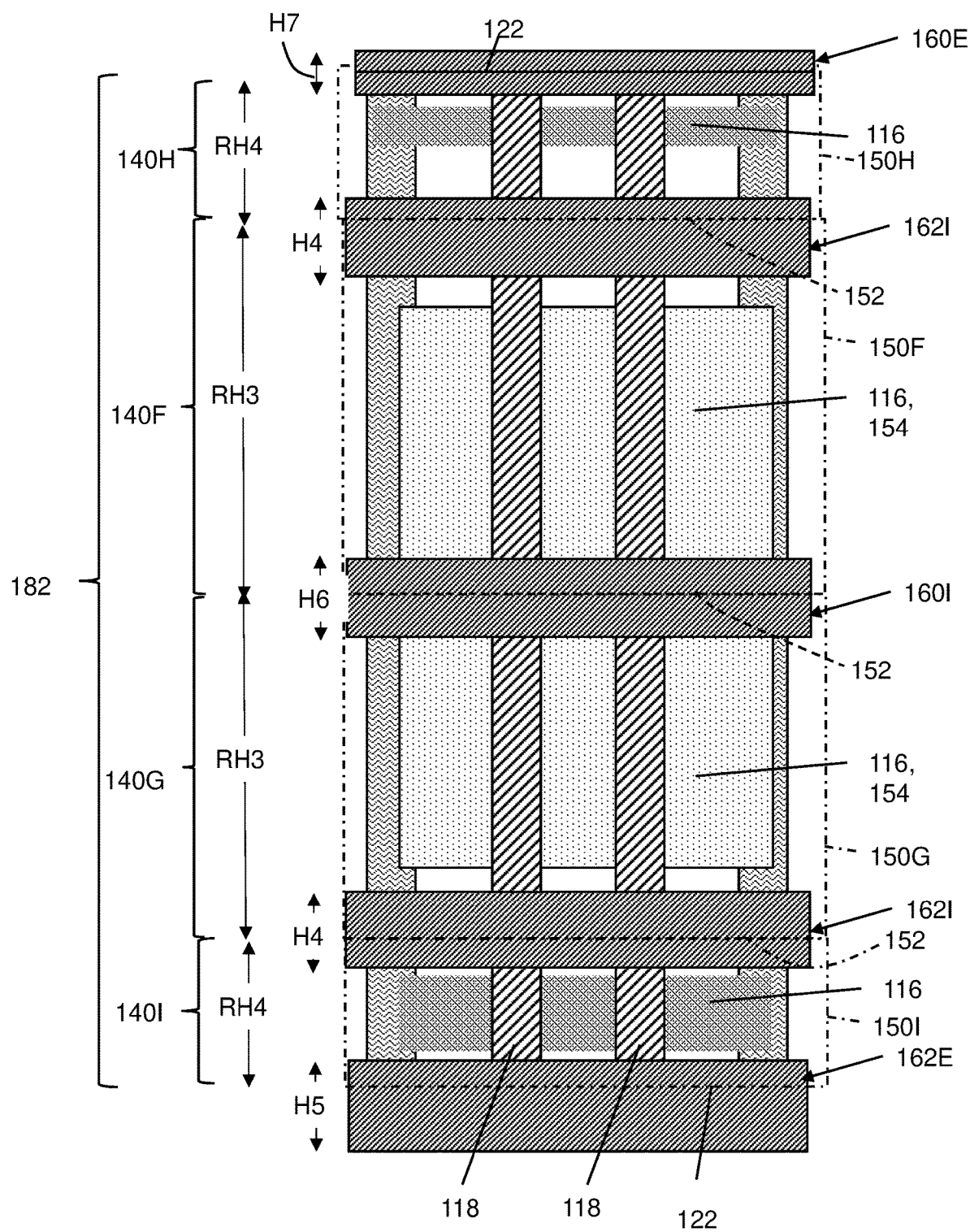
FIG. 14 shows a schematic top-down view of a device layer of a multi-row standard cell according to another embodiment.

FIG. 14 shows a schematic top-down view of a device layer (with power rails overlaid) on an illustrative MR cell 182 according to an alternative embodiment. In this embodiment, MR cell 182 may include portions 150F-I (four portions) that collectively include at least two first cell rows 140F, 140G having a first row height RH3 and at least two adjacent second cell rows 140H, 140I where the at least two adjacent cell rows 140H, 140I each have a second row height RH4 different than first row height RH3. The at least two first cell rows 140F, 140G are adjacent to at least two adjacent second cell rows 140H, 140I, e.g., one on each end of two cell row 140F, 140G, as shown. The cell height of MR cell 182 equals the sum of the at least two first row height(s) RH3 of the at least two first cell row 140F, 140G and the second row heights RH4 of the at least two adjacent second cell rows 140H, 140I, i.e., cell height=2RH3+2RH4.

FIGS. 13 and 14 also show a variety of configurations of power rails 160, 162. FIG. 13 shows MR cell 180 with two asymmetric power rails 162I with the same rail heights H1 for adjacent portions 150D, 150C and 150C, 150E; a symmetric power rail 160E for upper cell boundary 122 have rail height H2: and another asymmetrical power rail 162E for lower cell boundary 122 having a different rail height H3 than the other asymmetric power rails 162I, i.e., rail height H1.

In FIG. 14, MR cell 184 includes two asymmetric power rails 162I disposed in an asymmetric manner across row boundaries 152 between at least two other adjacent cell rows 140F, 140H and 140G, 140I of the plurality of cell rows of the MR cell. That is, between portions 150F, 150H and 150G, 150I. Asymmetric power rails 162I have the same rail height H4. MR cell 180 may also include another asymmetric power rail 162E disposed in an asymmetric manner across lower cell boundary 122 of row 140I to mate with another cell row of an adjacent cell (not shown). Asymmetric power rail 162E has a different rail height H5 than asymmetric power rails 162I, i.e., rail height H4. MR cell 182 also includes a symmetric power rail 160I at row boundary 152 between portions 150F, 150G having rail height H6, and a symmetric power rail 160I at upper cell boundary 122 having rail height H7 to mate with another cell row of an adjacent cell (not shown).

Figure 15:
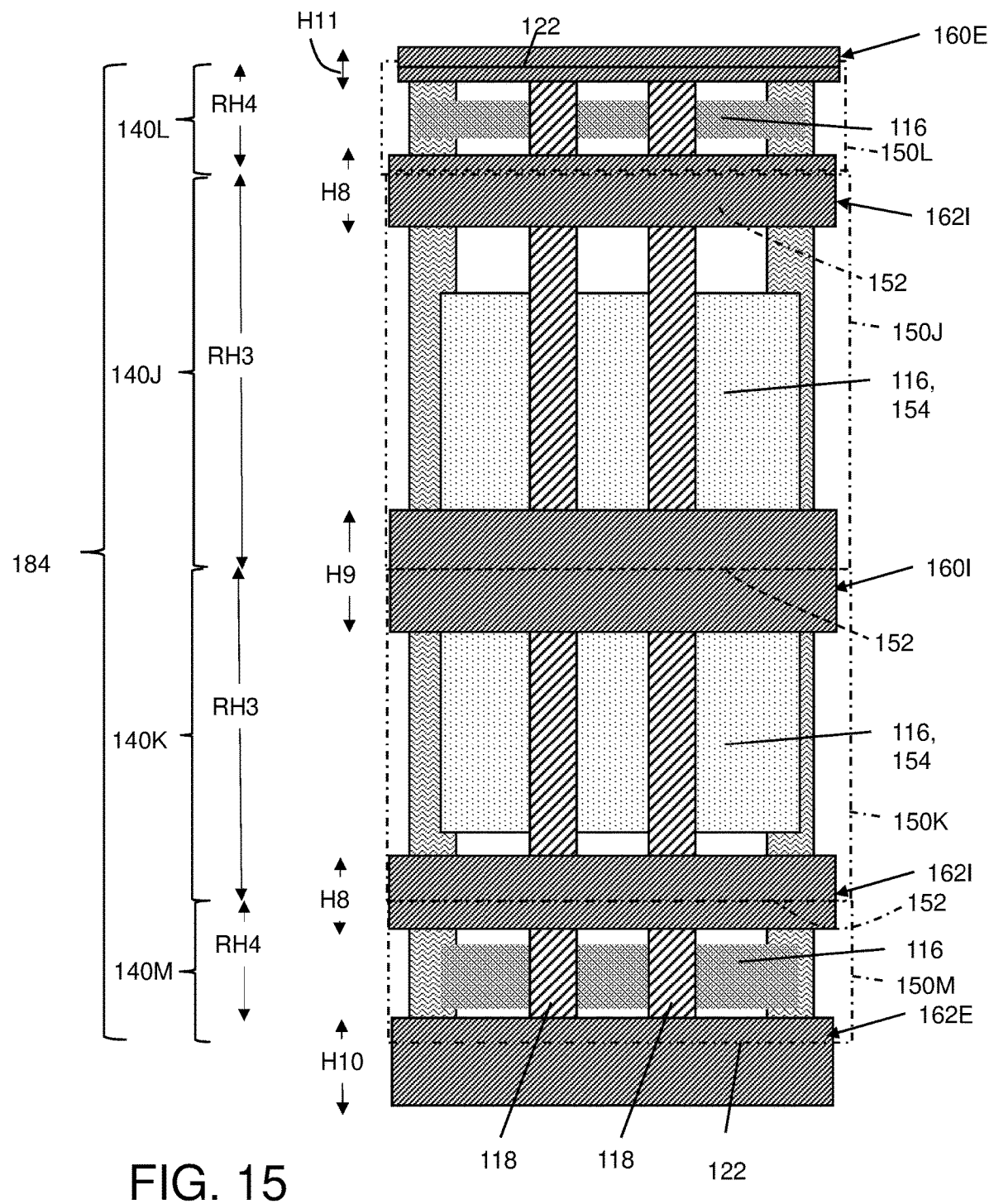
FIG. 15 shows a schematic top-down view of a device layer of a multi-row standard cell according to another embodiment.

FIG. 15 shows a schematic top-down view of a device layer (with power rails overlaid) of an illustrative MR cell 184 according to another embodiment. MR cell 184 may include two asymmetric power rails 162I disposed in an asymmetric manner across row boundaries 152 between at least two adjacent cell rows 140J, 140L and 140K and 140M of the plurality of cell rows of the MR cell. That is, between portions 150J, 150L and 150K, 150M. Asymmetric power rails 162I have the same rail height H8. MR cell 184 also includes a symmetric power rail 160I at row boundary 152 between portions 150F, 150G having rail height H9. Rail height H9 does not equal rail height H8. MR cell 184 may also include another asymmetric power rail 162E disposed in an asymmetric manner across lower cell boundary 122 to mate with a cell row of an adjacent cell (not shown). Asymmetric power rail 162E has a different rail height H10 than asymmetric power rail 162I, i.e., H9. MR cell 184 may also include symmetric power rail 160E at upper cell boundary 122 having rail height H11 to mate with another cell row of an adjacent cell (not shown).

While MR cells including two portions (FIG. 7-8), three portions (FIG. 10-13) or four portions (FIGS. 14-15) are illustrated, MR cells may include any number of portions 150 and related rows 140 to accommodate any grid arrangement, e.g., four or more. Each portion may include its own active region 116 or may share an active region 154 with an adjacent portion, as described herein.

Embodiments of the disclosure provide various technical and commercial advantages, examples of which are discussed herein. Multi-row cells (mixed track logic blocks) offer significant advantages relative to power, performance, area, and costs, especially in advanced technology nodes (e.g., beyond 14 nm), by having complex combinational cells of mixed track height cells. These complex combinational cells can be for such applications as: higher density cells, AND, OR, flip-flops, full adders. The MR cells can be multiple row heights (e.g., X, 3X or 2Y) or combinations of multiples of row heights (e.g., 3X+2Y, X+3Y, etc.), providing better placement flexibility for multi-row cells. Shared active region 154 removes the need to cut polyconductor gates 118, and removes the limitation that FETs are keyed to the size of the active region in a given individual cell. Shared active regions 154 can provide stronger forms of FETs than available in the individual cells with better performance than available from the individual cells, and further enable combinations of multiples of row heights. The asymmetric power rails can be shifted across cell boundaries between adjacent cells or within a row boundary within an MR cell to address electromigration/voltage drop (EM/IR) issues and can provide variable heights for better performance and EM/IR robustness. The multi-row cells and IC structures using the shared active region and/or asymmetric power rails, as described herein, occupy less surface area, and improve performance and power using cells with multiple cell heights. The multi-row cells also allow for seamless integration of multiple libraries having different cell heights while avoiding design rule violations, crowding and/or electromigration/voltage drop (EM/IR) issues.

The multi-row standard cells and IC structure as described herein are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present-disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
a plurality of cell rows extending in a first direction, wherein at least two cell rows of the plurality of cell rows have different row heights along a second direction;
a multi-row cell positioned in the at least two cell rows having different row heights, the multi-row cell having a cell height equal to a sum of the row heights of the at least two cell rows having different row heights;
at least one active region shared by portions of the multi-row cell across the at least two cell rows; and
a first asymmetric shared power rail disposed in an asymmetric manner across a row boundary between the at least two cell rows, wherein the at least one active region includes a first area having a first separation distance from the first asymmetric shared power rail along the second direction, and a second area having a second separation distance from the first asymmetric shared power rail along the second direction, the second separation distance being greater than the first separation distance.

2. The IC structure of claim 1, wherein the at least two cell rows include at least one first cell row having a first row height and at least two adjacent second cell rows, the at least two adjacent cell rows each having a second row height different than the first row height, wherein the at least one first cell row is adjacent to the at least two adjacent second cell rows,
wherein the cell height of the multi-row cell equals the sum of the first row height of the at least one first cell row and the second row heights of the at least two adjacent second cell rows.

3. The IC structure of claim 2, wherein the at least one first cell row includes at least two first cell rows, and the cell height of the multi-row cell equals the sum of the at least two first row heights of the at least two first cell rows and the second row heights of the at least two adjacent second cell rows.

4. The IC structure of claim 1, further comprising a second asymmetric power rail disposed in an asymmetric manner across a row boundary between at least two other adjacent cell rows of the plurality of cell rows, wherein the second asymmetric power rail has a different height than the first asymmetric power rail.

5. The IC structure of claim 1, wherein the plurality of cell rows include at least two other adjacent cell rows having row heights that are the same, and further comprising a symmetric power rail disposed in a symmetric manner across a boundary between the at least two other adjacent cell rows, wherein the symmetric power rail has a different height than the first asymmetric power rail.

6. The IC structure of claim 1, wherein the cell height of the multi-row cell equals the sum of the row heights of the at least two cell rows having different row heights.

7. The IC structure of claim 1, wherein the multi-row cell further includes:
a plurality of transistors at a device layer; and
at least a portion of an isolation area at an edge of the device layer defining a cell boundary.

8. The structure of claim 7, wherein a boundary between the first area and the second area of the at least one active region is free of gate structures thereover.

9. The structure of claim 1, wherein a boundary between the first area and the second area of the at least one active region is free of gate structures thereover.

10. A multi-row standard cell for an integrated circuit (IC) structure having logic arranged in a plurality of cell rows extending in a first direction, wherein at least two cell rows of the plurality of cell rows have different row heights along a second direction, the multi-row standard cell comprising:
at least two portions, each portion configured to be positioned in a respective row of the at least two rows of the plurality of rows having different row heights, wherein a cell height of the at least two portions equals a sum of the row heights of the at least two rows having different row heights;
at least one active region shared by the at least two portions;
a first asymmetric shared power rail disposed in an asymmetric manner across a cell boundary between the at least two portions, wherein the at least one active region includes a first area having a first separation distance from the first asymmetric shared power rail along the second direction, and a second area having a second separation distance from the first asymmetric shared power rail along the second direction, the second separation distance being greater than the first separation distance; and
a plurality of transistors at a device layer in each of the at least two portions.

11. The standard cell of claim 10, wherein the at least two portions include at least three portions and the at least two cell rows includes at least three cell rows.

12. The standard cell of claim 11, wherein the at least three cell rows include at least one first cell row having a first row height and at least two adjacent second cell rows, the at least two adjacent cell rows each having a second row height different than the first row height, wherein the at least one first cell row having the first row height is adjacent to the at least two adjacent second cell rows having the second row height,
wherein the cell height of the at least three portions equals the sum of the first row height of the at least one first cell row and the second row heights of the at least two adjacent second cell rows.

13. The standard cell of claim 11, wherein the at least two portions include at least four portions, and the at least one first cell row having the first row height includes at least two first cell rows having the first row height, and wherein the cell height of the at least four portions equals the sum of the at least two first cell rows having the first row height and the second row heights of the at least two adjacent second cell rows.

14. The standard cell of claim 10, further comprising a second asymmetric power rail disposed in an asymmetric manner across a cell boundary between at least two other portions, wherein the second asymmetric power rail has a different height than the first asymmetric power rail.

15. The standard cell of claim 10, wherein the first asymmetric shared power rail is located in a lowest routing metal layer.

16. The standard cell of claim 10, wherein the multi-row cell further includes:
a plurality of transistors at a device layer in each portion; and
at least a portion of an isolation area at an edge of the device layer defining a cell boundary.

17. An integrated circuit (IC) structure including a plurality of the multi-row standard cells of claim 10.

18. An integrated circuit (IC) structure, comprising:
a plurality of cell rows extending in a first direction, wherein at least two cell rows of the plurality of cell rows have different row heights along a second direction;
a multi-row cell positioned in the at least two cell rows having different row heights, the multi-row cell having a cell height equal to a sum of the row heights of the at least two cell rows having different row heights;
at least one active region shared by portions of the multi-row cell across the at least two cell rows and
a first asymmetric shared power rail disposed in an asymmetric manner across a row boundary between the at least two cell rows, wherein the at least one active region includes a first area having a first separation distance from the first asymmetric shared power rail along the second direction, and a second area having a second separation distance from the first asymmetric shared power rail along the second direction, the second separation distance being greater than the first separation distance.

19. The IC structure of claim 18, further comprising:
a second asymmetric power rail disposed in an asymmetric manner across a cell boundary between at least two other portions, wherein the second asymmetric power rail has a different height than the first asymmetric power rail.

20. The IC structure of claim 18, wherein the at least two cell rows include at least one first cell row having a first row height and at least two adjacent second cell rows, the at least two adjacent cell rows each having a second row height different than the first row height, wherein the at least one first cell row is adjacent to the at least two adjacent second cell rows,
wherein the cell height of the multi-row cell equals the sum of the first row height of the at least one first cell row and the second row heights of the at least two adjacent second cell rows.

* * * * *